United States Patent
Heiland

(10) Patent No.: US 7,269,995 B2
(45) Date of Patent: Sep. 18, 2007

(54) METHOD AND APPARATUS OF VIBRATION ISOLATION, IN PARTICULAR FOR ELECTRON BEAM METROLOGY TOOLS

(75) Inventor: Peter Heiland, Raunheim (DE)

(73) Assignee: Integrated Dynamics Engineering Gmb, Raunheim (DE)

( * ) Notice: Subject to any disclaimer, the term of this patent is extended or adjusted under 35 U.S.C. 154(b) by 91 days.

(21) Appl. No.: 10/949,069

(22) Filed: Sep. 24, 2004

(65) Prior Publication Data

US 2005/0076725 A1    Apr. 14, 2005

(30) Foreign Application Priority Data

Sep. 25, 2003    (DE) ................. 103 44 538

(51) Int. Cl.
*G01B 5/28* (2006.01)
(52) U.S. Cl. ....................................... 73/105
(58) Field of Classification Search ................... None
See application file for complete search history.

(56) References Cited

U.S. PATENT DOCUMENTS

| | | | | |
|---|---|---|---|---|
| 4,665,313 | A * | 5/1987 | Wells | 250/306 |
| 5,155,523 | A * | 10/1992 | Hara et al. | 355/53 |
| 5,823,307 | A * | 10/1998 | Schubert et al. | 188/378 |
| 6,518,721 | B2 | 2/2003 | Mayama | 318/632 |
| 6,521,891 | B1 | 2/2003 | Dotan et al. | 250/310 |
| 6,586,754 | B1 * | 7/2003 | Hultermans | 250/492.2 |
| 6,754,161 | B1 * | 6/2004 | Masuhara et al. | 369/112.01 |
| 2002/0036264 | A1 | 3/2002 | Nakasuji et al. | |

FOREIGN PATENT DOCUMENTS

| | | |
|---|---|---|
| DE | 29612349 U1 | 1/1998 |
| DE | 20102333 U1 | 6/2001 |
| EP | 0361932 | 4/1990 |

\* cited by examiner

*Primary Examiner*—Robert Raevis
(74) *Attorney, Agent, or Firm*—Ohlandt, Greeley, Ruggiero & Perle, L.L.P.

(57) ABSTRACT

There is provided a method and an apparatus for isolating mechanical vibrations reacting to beam metrology tools. The apparatus includes an outer structure for supporting a metrology instrument, and a chuck for holding a specimen with respect to the metrology instrument in an intended defined position for performing measurements on the specimen by the metrology instrument. The apparatus also includes at least one active vibration isolator means coupled to the chuck for compensating relative movement between the specimen and the metrology instrument. A method is also provided that includes detecting change of position of the specimen in response to mechanical vibrations, and effectuating an active modification of the position of the chuck in response to the detection for counteracting a relative displacement between the specimen and the metrology instrument.

15 Claims, 3 Drawing Sheets

METHOD AND APPARATUS OF VIBRATION ISOLATION, IN PARTICULAR FOR ELECTRON BEAM METROLOGY TOOLS

CROSS-REFERENCE TO RELATED APPLICATION

The present application is claiming priority of German Patent Application No. 103 44 538.2, filed on Sep. 25, 2003, the content of which is herein incorporated by reference.

BACKGROUND OF THE INVENTION

1. Field of the Invention

The invention relates to a method and an apparatus for isolating mechanical vibrations reacting to metrology tools, in particular beam metrology tools.

2. Description of Related Art

In particular, when using a beam metrology tool in industrial fabrication, often the environment is not optimal for the incorporated metrology instrument, in particular regarding the high resolution metrology using electron beam metrology instruments for example.

As known, such electron beam metrology instruments based on the principle of Scanning Electron Microscopes (SEM) are focusing an electron beam which scans an area of a certain specimen. As a result, certain reaction effects of the electron beam hitting the specimen are detected, whereby the intensity of the detected signal can be used to create an image of the scanned area.

In addition to generic SEM, an electron beam metrology instrument often is specialised as quality control tool in semiconductor or in general micro-technology fabrication. There the specimen, such as an chip or wafer, contains a larger number of measure points. In order to work the different measure points usually a chuck supported by a sophisticated mechanism, normally named stage, is used for positioning the specimen.

A major requirement of those instruments towards vibration isolation is to allow those instruments to achieve the necessary measurement resolution in spite of high disturbance levels.

Environmental disturbances of concern are on the one hand side electromagnetic disturbances, which deflect the electron beam from its intended path, and on the other hand side mechanical vibrations due to floor vibration and/or due to acoustic excitations.

Besides electromagnetic disturbances, mechanical vibrations due to floor vibration often can be reduced effectively by conventional vibration isolation principles where an isolating layer can be inserted into the path of the disturbance from the floor via the supporting structure to the actual measurement tool.

However, in particular mechanical vibrations due to acoustic excitations are much harder to influence as the disturbances directly affect the mechanical supporting structure, providing for example an encapsulating vacuum chamber for the electron beam generating unit as well as for a stage positioning unit. Usually, in practice at least the electron beam and the specimen are enclosed in a vacuum.

Moreover, even if a supporting or outer structure providing a vacuum chamber and hence, enabling the fact that the measurement takes place in vacuum, appears to be ideal to isolate from acoustic excitation, the vacuum chamber usually does not merely bear as function to allow vacuum but unfortunately also to give a stiff structure between electron beam on one side and specimen on the other side.

Trying however to use low stiffness elements in order to mechanically de-couple the chuck and the electron beam from the enclosing vacuum chamber leads into disadvantages concerning the positioning accuracy between specimen and chamber and hence, is a drawback to measurement resolution by itself.

SUMMARY OF THE INVENTION

These and other disadvantages have lead to the object of the present invention to provide a new and improved way of mechanical vibration isolation of metrology tools, in particular whereby which standard instruments with minor modification may be allowed as well as the reaction to constraints and special weakness of real life instruments.

The inventive solution is surprisingly obtained by a subject matter comprising the features according to respective independent claims.

Advantageous and/or preferred embodiments or developments are the subject matter of the respective dependent claims.

Accordingly, the invention proposes to isolate mechanical vibrations, in particular based on acoustic noise, reacting to a metrology tool comprising an outer structure for supporting a metrology instrument and a chuck for holding a specimen with respect to the metrology instrument in an intended defined position to perform measurements on the specimen by said metrology instrument, in that an offset of said position in response to mechanical vibrations is detected and an active modification of the position of the chuck is effectuated in response to said detection for counteracting a relative displacement between the specimen and the metrology instrument.

Moreover, the invention is proposing a correspondingly designed apparatus of mechanical vibration isolation of metrology tools comprising a supporting structure for the metrology instrument and the chuck for holding the specimen in the defined position to perform measurements on the-specimen by said metrology instrument, in that the chuck is coupled to a controllable active position displacement means for counteracting relative displacement between the specimen and the metrology instrument.

According to very advantageous embodiments, the outer structure of the inventive apparatus is designed as a vacuum chamber, so the invention is utilising the fact that the measurement process is in vacuum.

To easily detect such an offset, the invention suggests to measure at least one parameter indicating a motion of the chuck and/or of the metrology instrument, based on which a relative displacement between the specimen and the metrology instrument with respect to the intended defined position is calculated, in particular by means of a control system adapted to effectuate said active modification of the position of the chuck.

For applying the invention to different specific given real life applications without undue modifications, the detection can be performed online by feeding the at least one measured parameter back to the control system for directly effectuating said active position modification of the chuck but also can be performed off-line by feeding the at least one measured parameter to an open feed forward control system for tuning a necessary effectuation of active position modification.

As a further advantage, the invention enables a respective optimised realisation depending on the specific characteristics of the given structure since the measuring of the at least one parameter can be performed by a plurality of different ways.

According to a first preferred embodiment, the relative displacement between the chuck and the metrology instrument is directly measured, preferably by using a capacitive measurement device or an interferometer. In this regard it is further suggest to define a first measure point at the chuck and a second measure point at the far end of the metrology instrument to easily achieve best accuracy of the measure relative displacement even by means of commercially available measurement sensors.

As an alternative, the displacement of the chuck and the displacement of metrology instrument respectively related to a common point of reference, such as the supporting structure, are measured and then subtracted from each other for calculating the offset.

As a further alternative or in addition, i.e. instead of or besides measuring the displacement, at least one parameter is measured indicating an acceleration of the chuck and/or of the metrology instrument. This can be practically implemented by use of in substantial every standard acceleration sensor.

According to a further advantageous refinement, it is proposed to provide a stiff interconnection between the structure and the metrology instrument or between the structure and a stage supporting the chuck for enabling the neglect of measuring the motion of the metrology instrument or respectively of the chuck, without introducing a noticeable guidance flaw.

According to a further preferred development, the invention comprises the step of measuring a displacement directly between the instrument's beam and the specimen instead of its calculation. In this regard, a spot mode signal is usefully applied on a structured measure for detecting the displacement by intensity variation of the applied signal due to motion of the beam over the specimen.

As a consequence, the proposed inventive apparatus is advantageously designed in that the chuck and the controllable active position displacement means are parts of a control system having sensor means for detecting displacements and/or accelerations.

Practically, the active position displacement means is connected to a controller of the control system for controlling the movement of the chuck by respectively activating the position displacement means depending on an applied sensor output signal.

For enabling an immediate and extremely flexible active position manipulation, the position displacement means preferably comprises a plurality of spaced apart arranged sub-assemblies, each of which including a displacement actuator and a stiffness element.

To easily put the invention into practice, in particular to easily manipulate the position of the chuck, it is further proposed to arrange the active position displacement means between the chuck and the outer structure or between the chuck and the stage in case a stage is included by the outer structure for supporting the chuck.

For accurately effectuate a counteracting motion of the chuck, the active position displacement means is formed by means of a displacement actuator in combination with a stiffness element attached therewith, preferably with the displacement actuator connected to the stage or the outer structure and with the stiffness element connected to the chuck.

The invention is further proposing to realise the displacement actuator by use of a piezo-element, in particular comprising a piezo-ceramic material, which can be manipulate by applying respective control currents or voltages causing a defined expansion, contraction, bending and/or shearing action of the displacement actuator.

The stiffness element is practically comprising an elastomeric material.

The invention is moreover covering a smart chuck device comprising a chuck with an active displacement actuator attached thereto and designed to be used within a afore described apparatus.

Practically, the displacement actuator of such a smart chuck device comprises connecting means for mechanically connecting the actuator to a stage or the outer structure having complementary connecting means and connecting means for electrically connecting the actuator to a controller having complementary connecting means.

Accordingly, the invention is covering a new and improved approach to integrated vibration isolation, especially suitable as solution for today's vibration problem in state-of-the-art electron beam metrology instruments. In particular utilising the fact that with those instruments measurement process is in vacuum. As such the inventive approach applies to other metrology instruments with the measurement process in vacuum, as well. The inventive approach however, can be used successfully also with atmospheric metrology even if the advantage to conventional vibration isolation may be slightly reduced.

BRIEF DESCRIPTION OF THE DRAWING.

Subsequently, the invention is described in more detail with regard to a preferred but exemplar embodiment and based on the attached drawings, in which.

DESCRIPTION OF THE INVENTION

Figure 5:
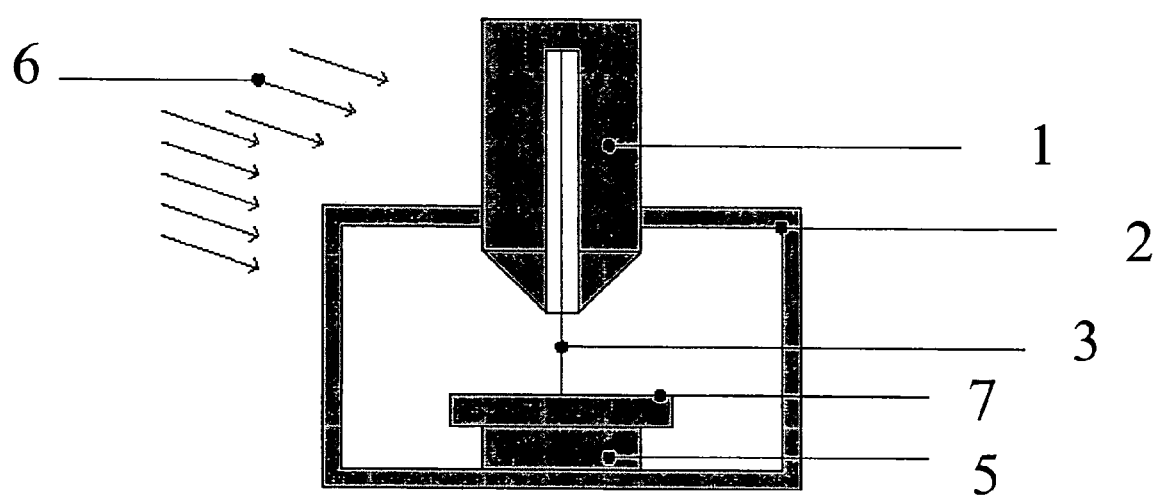
FIG. 5 is showing a simplified arrangement model of an electron beam metrology instrument according to the state of the art.

Referring next to a preferred embodiment of the invention in more detail, a simplified model of an exemplar state of the art electron beam metrology tool is schematically depicted in FIG. 5.

Based on FIG. 5 an outer structure 2 is forming a vacuum chamber and is supporting an electron beam metrology instrument or electron beam column 1. The vacuum chamber 2 and the electron beam column 1 form a body with a finite structural stiffness. In side of the chamber 2 a stage 5 is located which serves the task to position a chuck 7, which holds the specimen with respect to the beam, so that a focused electron beam 3 can be scanned an area of the specimen in order to detect certain reaction effects of the electron beam 3 hitting the specimen at given points, thereby using the intensity of the detected signal to create an image of the scanned area.

Thus, a usually used stage 5 for positioning the chuck 7 and hence the specimen, is supposed to be created as a sophisticated mechanism in order to work different given measure point by moving the specimen below the beam in order to respectively select a certain given measure point.

During the actual measurement the stage 7 must fix the position with respect to the beam 3. Any relative motion or displacement between the specimen and the beam 3 due to flexing in the entire structure is causing a limitation of the measurement resolution. In a real life situation the structure of the vacuum chamber 2 and of the electron beam column 1 however, is excited by mechanical vibrations. Even if mechanical vibrations due to floor vibration often can be reduced effectively by conventional vibration isolation principles, at least vibrations due to ambient acoustic noise, as referenced by the arrows 6, in the structure are still transferred into the stage 5 and the chuck 7. As a result the flexing in the structure creates an offset with regard to the indented aligned position, i.e. causes a relative displacement between the beam 3 and the specimen.

Figure 1:
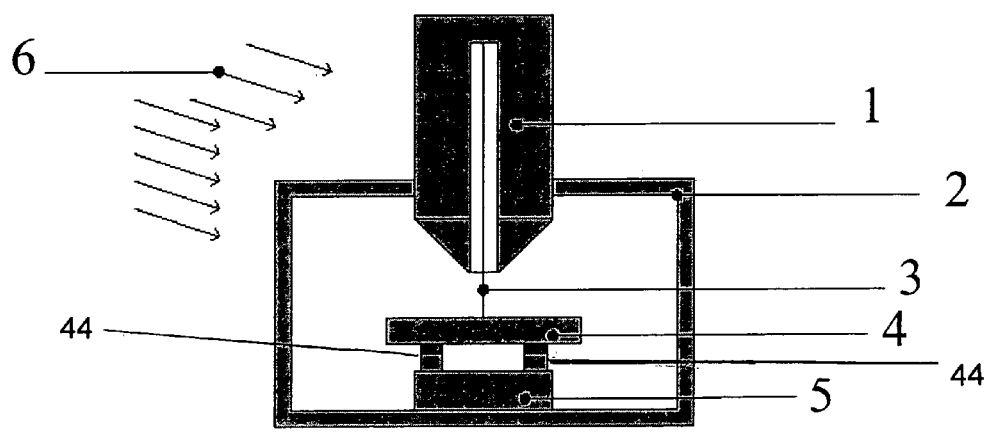
FIG. 1 is showing a simplified arrangement model of an electron beam metrology instrument with a smart chuck according to the invention.
Figure 2:
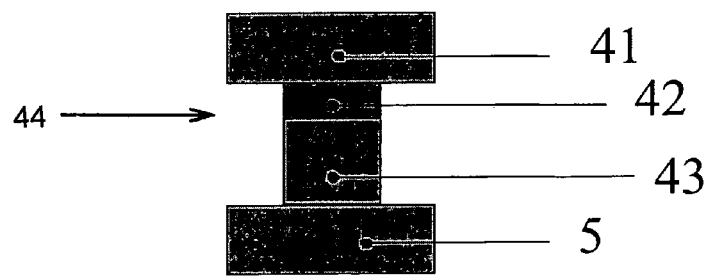
FIG. 2 is schematically showing a sub-assembly of the active vibration isolator for the smart chuck according to the invention.

In comparison to such a state of the art arrangement, FIG. 1 is depicting a simplified arrangement model of an electron beam metrology instrument 1 with a smart chuck 4 according to the invention. The smart chuck 4 comprises a chuck 41 similar to the standard chuck 7 but enhanced by a small controllable active position displacement means or active vibration isolator means 42, 43 attached to the chuck 41, as depicted in more detail in FIG. 2 showing a sub-assembly part 44 of such active position displacement means or active vibration isolator means 42, 43.

It has to be mentioned, that depending on the respective specific application or given structure of metrology tool, the position displacement or vibration isolator means 42, 43 may comprise a plurality of such sub-assemblies spaced apart from each other to enable an immediate and flexible active vibration isolation or position correction, preferably in all degrees of freedom.

Based thereon, each sub-assembly part of the position displacement or vibration isolator means 42, 43 is designed to expand, contract, bend and/or shear in a way that relative motion between the stage 5 and the electron beam 3 as a result of flexing in the column, vacuum chamber 2 and stage 5 is essentially absorbed or reduced, so that the chuck 41 does only execute reduced relative motion with respect to the beam 3.

According to the preferred embodiments, the inventive active vibration isolator of the smart chuck works as a combination of displacement actuator 43 and a stiffness element 42. In order to effect a controllable expanding, contracting, bending and/or shearing action it is suggested to utilise for a respective displacement actuator 43 a piezoceramic material enabling the transformation of a defined control current or voltage applied thereto into controllable mechanical energy. The stiffness element 42 for providing an attenuation in direction to the chuck 41 is realised for example by an elastomere material.

Figure 3:
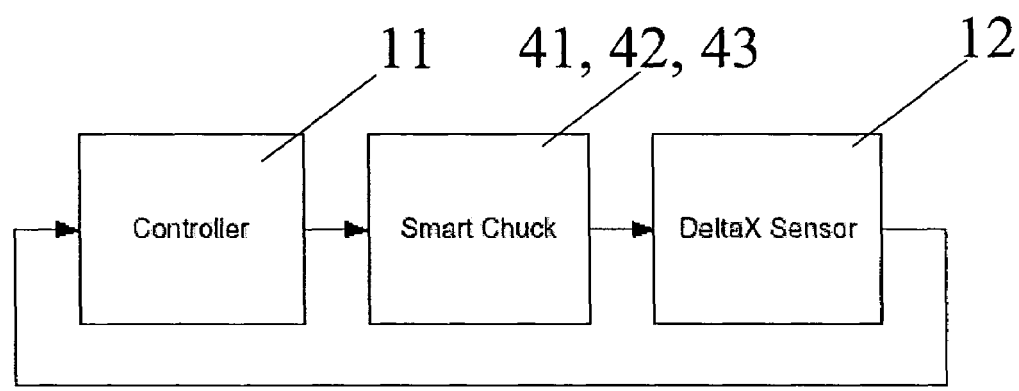
FIG. 3 is schematically showing the main components of the control system for the smart chuck.

As a consequence, the inventive smart chuck 4 is proposed to be part of a control system, as depicted for example in FIG. 3. The control system comprises at least one sensing element 12 for ascertaining a relative displacement "deltaX" and/or a relative motion between the beam 3 and the specimen and accordingly the chuck 41, as described in more detail below. With a preferred online control system according to FIG. 3 the output signal or signals of the at least one sensing element 12 is fed back as an input of an electronic controller 11 for calculating a position displacement of the chuck 41 necessary to absorb the ascertained relative displacement "deltaX"0 and/or relative motion and then to correspondingly activate the respective sub-assembly or sub-assemblies of the position displacement or vibration isolator means 42, 43.

Regarding specific preferred system variants in more detail, it has to be mentioned that for the sensing element 12, in particular for the deltaX sensor different solutions are possible. Depending on the characteristic of the structure, already available sensor devices which provide signals which can be used as deltaX sensor signal, the vibration isolation requirements and other constraints of a given instrument, preferably one of the subsequent different possible alternatives should be selected.

Figure 4:
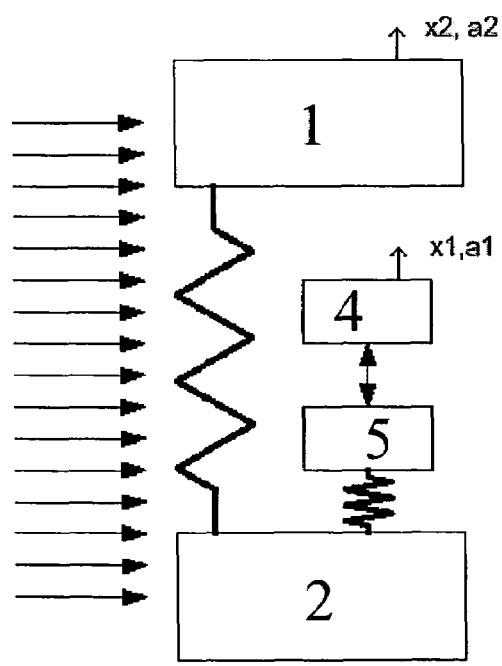
FIG. 4 is showing a simple mechanical model of the dynamics system in an electron beam metrology.

In order to illustrate the differences a simplified mechanical model according to FIG. 4 is to be introduced, which describes the dynamic situation of the vacuum chamber, electron beam column and stage in combination with the Smart Chuck concept in general aspects.

As can be seen from FIG. 4, the mechanical model substantially consists of four bodies and two stiffness. The mechanical structure of the vacuum chamber 2 and the electron beam column 1 may be represented as a two mass system, where the two masses are linked by a stiffness. Hence, due to external excitation forces relative motion between column and chamber is possible.

The stage 5 is represented by another body which is attached to the chamber 2 by a further stiffness.

Here relative motion is possible between the chamber 2 and the stage 5. The forth body is the smart chuck 4 which is attached to the stage 5 by the inventive active isolator 42, 43. The relative displacement between specimen and beam, which is called deltaX, can be expressed as absolute displacement of the chuck 4 minus absolute displacement of the column or $x_1-x_2$.

In consequence to above said the most straight forward approach is to the relative displacement between chuck 4 and column ($x_1-x_2$) and use as input to the control system for the smart chuck. For this an interferometer or capacitive measurement device may be used depending on specific environment condition or restraints.

For best accuracy the relative displacement of the chuck 4 in the vacuum chamber 2 and the top end of the column should be used. These two locations are relative far from each other that a capacitive sensor cannot be always used. Moreover, an interferometer, which easily could overcome the distance can not always be used as an optical path between chuck and top end of the column can not be guaranteed.

Instead of or in addition to the relative displacement also the relative acceleration could be measured.

Here two independent acceleration sensors are suggested to be attached to the optimal location. The comparison of the two absolute acceleration signals provides the relative acceleration.

The above described principle can be simplified in case the structure of chamber and column is comparably stiffer than the structure of the stage attached to the chamber. In this case and regarding FIG. 4 $a_2$ is small compared to $a_1$ and can be neglected. Correspondingly, an absolute acceleration will be measured or determined.

Instead of measuring motion at certain locations of the structure in order to estimate the relative motion between specimen and beam in certain situation it might be required to actually measure the relative displacement between specimen and beam directly. This can be done by the method spot mode measurement. Here the displacement of the beam on a structured measured is preferably detected by intensity variation of the detection signal due to motion of the beam over the specimen. Since this method can not be applied during the metrology process but only as an off-line alignment process, an open loop feed-forward control needs top be applied which is tuned with the help of the spot mode signal.

This version is especially useful when the structure of the stage is comparably stiffer than chamber and the column. In this case a1 is small compared to and a2 can be neglected. However, flexing of the column structure not only results in a relative displacement between the electron beam origin and the specimen but also relative displacement between the electro-magnetic lenses. In consequence the electromagnetic focusing is-also affected by the deflection. The combination of the various mechanical and electron-optical effect however, usually can only be calculated with greatest difficulty. Hence, measuring the spot mode signal offers a convenient solution.

It is believed it will become known by a person skilled in the art that the new and inventive approach of integrated vibration isolation electron beam metrology instruments as described may be adapted to several specific conditions without leaving the scope of protection as defined by the appended claims. The inventive concept allows to use standard instruments with minimal modification. The flexibility of different sensor signals as input for the control system allows to respond to the constraints and special weaknesses of real life instruments.

The invention claimed is:

1. An apparatus for mechanical vibration isolation of metrology tools, comprising:
    a supporting outer structure including a metrology instrument and a chuck for supporting a specimen in a position to perform measurements on the specimen by the metrology instrument; and
    at least one active vibration isolator means connected to the chuck for compensating relative movement between the specimen and the metrology instrument, wherein the at least one active vibration isolator means includes a displacement actuator and a stiffness element, wherein the displacement actuator comprises a piezo-ceramic material.

2. The apparatus of claim 1, wherein the chuck and the vibration isolator means are part of a control system having sensor means for detecting relative movements.

3. The apparatus of claim 2, wherein the sensor means is selected from the group consisting of an interferometer, a capacitive measurement device an acceleration sensor unit, and any combinations thereof.

4. The apparatus of claim 2, wherein the sensor means includes a spot mode signal.

5. The apparatus of claim 4, wherein the control system is an open loop feed forward control system.

6. The apparatus of claim 1, further comprising:
    sensor means; and
    an electronic controller connected to the active vibration isolator means for controlling the movement of the chuck by activating the active vibration isolator means depending on a relative movement between the chuck and a metrology beam detected by the sensor means.

7. The apparatus of claim 1, wherein the stiffness element includes an elastomeric material.

8. The apparatus of claim 1, further comprising a stage housed by the supporting outer structure for supporting the chuck.

9. The apparatus of claim 1, further comprising a stage housed by the supporting outer structure for supporting the chuck, wherein the active vibration isolator means is arranged in a position selected from the group consisting of between the chuck and the supporting outer structure, between the chuck and the stage, and between the chuck and both the supporting outer structure and the stage.

10. The apparatus of claim 1, wherein the supporting outer structure can enable measurement in a vacuum or in an atmospheric environment.

11. The apparatus of claim 1, wherein the metrology instrument is an electron beam metrology instrument.

12. The apparatus of claim 1, wherein the active vibration isolator means includes a plurality of sub-assemblies, and wherein each sub-assembly includes a displacement actuator and a stiffness element.

13. A smart chuck adapted to be used within a metrology instrument, comprising:
    a chuck for supporting a specimen in a position to perform measurements on the specimen by the metrology instrument; and
    at least one controllable active vibration isolator means connected to the chuck for compensating relative movement between the specimen and the metrology instrument,
    wherein the vibration isolator means comprises a piezo-ceramic to be connected to an electronic controller.

14. The smart chuck according to claim 13, wherein the vibration isolator means comprises an elastomer as a stiffness element.

15. The smart chuck according to claim 13, wherein the vibration isolator means comprises a displacement actuator and a stiffness element.

* * * * *